United States Patent
Park (10) Patent No.: US 9,871,532 B1
(45) Date of Patent: Jan. 16, 2018

(54) DIGITAL TO-ANALOG CONVERTERS WITH NON-BINARY WEIGHTED CELL ARRAY

(71) Applicant: MediaTek Inc., Hsin-Chu (TW)

(72) Inventor: Henry Arnold Park, Irvine, CA (US)

(73) Assignee: MediaTek Inc., Hsin-Chu (TW)

(*) Notice: Subject to any disclaimer, the term of this patent is extended or adjusted under 35 U.S.C. 154(b) by 0 days.

(21) Appl. No.: 15/448,388

(22) Filed: Mar. 2, 2017

Related U.S. Application Data (60) Provisional application No. 62/385,301, filed on Sep. 9, 2016.

(51) Int. Cl.
  *H03M 1/10* (2006.01)
  *H03M 1/80* (2006.01)

(52) U.S. Cl.
  CPC ........... *H03M 1/80* (2013.01); *H03M 1/1009* (2013.01)

(58) Field of Classification Search
  CPC .............................. H03M 1/80; H03M 1/1009
  USPC .................. 341/145, 120, 144, 118
  See application file for complete search history.

(56) References Cited

U.S. PATENT DOCUMENTS

| | | | | |
|---|---|---|---|---|
| 5,293,166 A | * | 3/1994 | Ta | ....................... H03M 1/0604 |
| | | | | 341/118 |
| 5,790,060 A | * | 8/1998 | Tesch | .................... H03M 1/089 |
| | | | | 341/119 |
| 6,967,609 B1 | * | 11/2005 | Bicakci | ............ H03K 17/04106 |
| | | | | 341/144 |

* cited by examiner

*Primary Examiner* — Peguy Jean Pierre
(74) *Attorney, Agent, or Firm* — Wolf, Greenfield & Sacks, P.C.

(57) ABSTRACT

According to at least one aspect, a digital-to-analog converter (DAC) circuit configured to receive a digital signal and provide an analog signal is provided. The DAC circuit includes a first circuit configured to receive a first portion of the digital signal and generate a first output voltage at a level selected from a first plurality of levels where at least two adjacent voltage levels have a first potential difference. The DAC circuit further includes a second circuit configured to receive a second portion of the digital signal and generate a second output voltage at a level selected from a second plurality of levels where at least two adjacent voltage levels have a second potential difference and the second circuit includes a compensation circuit configured to adjust the second potential difference such that the second potential difference is an integer multiple of the first potential difference.

20 Claims, 7 Drawing Sheets

DIGITAL TO-ANALOG CONVERTERS WITH NON-BINARY WEIGHTED CELL ARRAY

CROSS-REFERENCE TO RELATED APPLICATIONS

This application claims priority to U.S. provisional application Ser. No. 62/385,301 titled "LOW SUPPLY HIGH-SPEED DIGITAL-TO-ANALOG CONVERTER," filed Sep. 9, 2016, which is hereby incorporated herein by reference in its entirety.

BACKGROUND

1. Technical Field

The techniques described herein relate to techniques for improving the performance of digital-to-analog converters.

2. Discussion of the Related Art

Digital-to-analog converters (DACs) are used to convert a digital signal to an analog signal. For example, a DAC may be employed to generate a voltage waveform based on a stream of digital values. DACs typically provide an output voltage with a magnitude that corresponds to a magnitude of the received digital value. In particular, the output voltage of a DAC may be proportional to the magnitude of the received digital value.

SUMMARY

According to at least one aspect, a digital-to-analog converter (DAC) circuit configured to receive a digital signal and provide an analog signal is provided. The DAC circuit includes a first circuit configured to receive a first portion of the digital signal and generate a first output voltage at a level selected from a first plurality of levels based on the first portion of the digital signal where at least two adjacent voltage levels of the first plurality of levels have a first potential difference. The DAC circuit further includes a second circuit configured to receive a second portion of the digital signal and generate a second output voltage at a level selected from a second plurality of levels based on the second portion of the digital signal where at least two adjacent voltage levels of the second plurality of levels have a second potential difference and the second circuit includes at least one compensation circuit configured to adjust the second potential difference such that the second potential difference is an integer multiple of the first potential difference. The DAC circuit further includes an output node coupled to the first circuit and the second circuit, the output configured to provide the output analog signal.

In some embodiments, the first circuit includes a first impedance array and the second circuit includes a second impedance array that is weighted differently than the first impedance array. In some embodiments, the first impedance array includes a first binary weighted impedance array and the second impedance array includes a second binary weighted impedance array, each impedance of the second binary weighted impedance array having an impedance that is not a multiple of two of any single impedance in the first binary weighted impedance array. In some embodiments, the first impedance array includes a binary weighted impedance array and the second impedance array includes a non-binary weighted impedance array.

In some embodiments, the digital signal is a binary coded signal comprising a plurality of bits. In some embodiments, the DAC circuit further includes a third circuit configured to receive the first portion of the digital signal, convert the first portion of the digital signal from a binary coding to a non-binary coding, and provide the converted first portion of the digital signal to the first circuit. In some embodiments, the first portion of the digital signal is a first subset of the plurality of bits comprising a most significant bit of the plurality of bits and the second portion of the digital signal is a second subset of the plurality of bits comprising a least significant bit of the plurality of bits.

In some embodiments, the second circuit includes a biasing circuit configured to generate at least one bias signal and the compensation circuit is configured to adjust the second potential difference based on the at least one bias signal. In some embodiments, the biasing circuit includes a replica of the first circuit, the second circuit, or a combination thereof.

According to at least one aspect, a DAC circuit configured to receive a digital signal comprising a plurality of bits and provide an analog signal is provided. The DAC circuit includes a first cell array comprising a first plurality of cells each being configured to receive a state of one bit from a first subset of the plurality of bits and provide an output based on the received state of the one bit, each cell in the first cell array comprising an inverter coupled in series with one impedance from a first impedance array and a compensation circuit coupled in parallel with the inverter and the one impedance from the first impedance array, the compensation circuit configured to receive at least one bias signal and adjust the output of the at least one cell based on the at least one bias signal. The DAC circuit further includes a second cell array comprising a second plurality of cells each being configured to receive a state of one bit from a second subset of the plurality of bits and provide an output based on the received state of the one bit, each cell in the second cell array comprising an inverter coupled in series with one impedance from a second impedance array. The DAC circuit further includes an output coupled to the first and second cell arrays, the output being configured to provide the analog signal.

In some embodiments, the first impedance array is weighted differently than the second impedance array. In some embodiments, the first impedance array includes a first binary weighted impedance array and the second impedance array includes a second binary weighted impedance array, each impedance of the second binary weighted impedance array having an impedance that is not a multiple of two of any single impedance in the first binary weighted impedance array. In some embodiments, the first impedance array is a binary weighted impedance array and the second impedance array is a non-binary weighted impedance array.

In some embodiments, the compensation circuit includes a first transistor coupled in series with a second transistor, each of the first and second transistors having a gate terminal configured to receive the state of one bit from a first subset of the plurality of bits and a drain terminal coupled to the one impedance from the first impedance array. In some embodiments, the first transistor is a p-type transistor and the second transistor is an n-type transistor. In some embodiments, the compensation circuit further includes a third transistor coupled between a source terminal of the first transistor and a supply voltage and a fourth transistor coupled between a source terminal of the second transistor and a reference potential. In some embodiments, the third transistor includes a gate terminal configured to receive a first bias signal and the fourth transistor includes a gate terminal configured to receive a second bias signal.

In some embodiments, the digital signal is binary coded, thermometer coded, or a combination thereof. In some embodiments, the DAC circuit further includes a biasing circuit configured to generate the at least one bias signal. In some embodiments, the biasing circuit includes a replica of at least a portion of the first and second plurality of cells.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Conventional voltage-mode (VM) digital-to-analog converters (DACs) may be well suited for high-speed and low-power applications, such as in wireless transmitters. A VM DAC typically uses a binary weighted impedance array that has impedance values that progressively increase by a factor of two (e.g., the impedance set—30 Ohms (Ω), 60Ω, and 120Ω). In a VM DAC, each impedance in the impedance array is typically coupled between an output of the DAC and a switch that selectively couples the impedance to either a supply voltage or ground. The state of the switches in the array is controlled using the received signal to generate the output voltage. The maximum output swing voltage of these VM DACs, however, is typically limited by the net termination impedance requirement for the VM DAC (e.g., 50Ω) and supply level provided to the VM DAC. For example, a VM DAC with a 50Ω termination impedance, a 50Ω load impedance, and a supply voltage of 0.8 Volts (V) can produce a differential peak-to-peak output swing voltage of 0.8 V. In wireless transmitter applications, a large output swing voltage is generally preferred because the large output swing voltage may improve a signal-to-noise ratio (SNR) of the wireless transmitter. To increase the maximum output swing voltage of a VM DAC without increasing the supply voltage, the termination impedance of the VM DAC must be reduced.

Figure 7A:
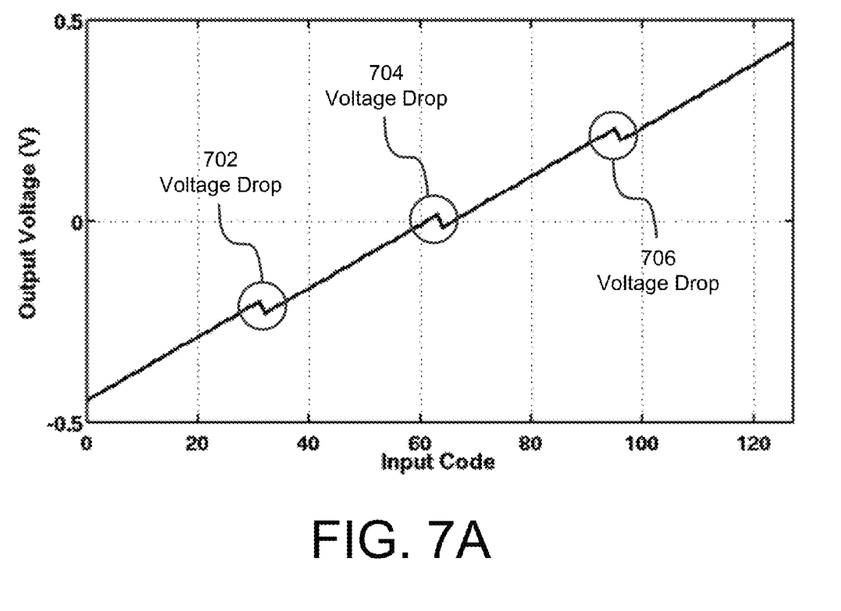
FIG. 7A shows an output voltage of a DAC without a compensation circuit, according to some embodiments.

The present inventor has appreciated that a VM DAC's net termination impedance is directly impacted by the impedances associated with the most significant bits (MSBs) in the binary weighted impedance array. For example, a VM DAC producing 1 V differential peak-to-peak output swing voltage with a supply voltage of 0.8 V requires a net terminal impedance of 30Ω. The first two MSB impedances in the binary weighted impedance array of this VM DAC are 60Ω and 120Ω. The two MSB impedances (60Ω and 120Ω) may be scaled up in an attempt to increase the net termination impedance (e.g., to 50Ω) while maintaining the same differential peak-to-peak output swing voltage. However, the impedances for the MSBs no longer have an impedance with a magnitude that is an integer multiple of two of the magnitude of the impedances for the least significant bits (LSBs). Such a mismatch may yield unsatisfactory performance. FIG. 7A shows an example voltage output of a 7-bit DAC formed by directly combining a first VM DAC for the LSBs with a binary weighted impedance array (e.g., 200Ω, 400Ω, and 800Ω) and a second VM DAC for the MSBs with impedances in the impedance array that are not an integer multiple two of the impedances in the first DAC (e.g., 60Ω and 120Ω). Such a DAC may receive a 7-bit binary coded signal, use the first VM DAC to convert the 5 LSBs, and use the second VM DAC to convert the 2 MSBs. The voltage output in FIG. 7A was formed by sweeping the 7-bit binary coded signal from 0 to 127. As shown, the output voltage of the 7-bit DAC dropped at three points shown as voltage drops 702, 704 and 706. Such a non-linear relationship between the magnitude of the 7-bit binary coded signal and the output voltage is undesirable in a DAC.

The voltage drops 702, 704, and 706 may be caused by transitions between the first VM DAC and the second VM DAC. For example, the increase in the output voltage produced in response to an increase in the input digital value by 1 (hereinafter referred to as a "step size") of the first VM DAC may be inconsistent with the step size produced by the second VM DAC. For example, the step size of the first VM DAC may not be an integer multiple of two of the step size of the second VM DAC. Thereby, a transition between two values in the 7-bit binary coded signal that causes a transition between the first VM DAC and the second VM DAC results in a voltage drop. For illustration, Table 1 is provided below that shows the relationship between the 7-bit binary coded signal and the resulting coded signals for the first VM DAC and the second VM DAC. As shown, there is a transition between the first VM DAC and the second VM DAC when the 7-bit binary coded input signal transitions from 31 to 32, 63 to 64, and 95 to 96 (which correspond to the voltage drops 702, 704, and 706, respectively).

TABLE 1

Relationship between 7-bit binary coded input signal and the resulting coded signals for first VM DAC and the second VM DAC

| Number | Binary Coded Input Signal | Signal for Second VM DAC | Signal for First VM DAC |
| --- | --- | --- | --- |
| 0 | 0000000 | 00 | 00000 |
| 1 | 0000001 | 00 | 00001 |
| 2 | 0000010 | 00 | 00010 |
| * * * | * * * | * * * | * * * |
| 31 | 0011111 | 00 | 11111 |
| 32 | 0100000 | 01 | 00000 |
| 33 | 0100001 | 01 | 00001 |
| * * * | * * * | * * * | * * * |
| 63 | 0111111 | 01 | 11111 |
| 64 | 1000000 | 10 | 00000 |

TABLE 1-continued

Relationship between 7-bit binary coded input signal and the resulting coded signals for first VM DAC and the second VM DAC

| Number | Binary Coded Input Signal | Signal for Second VM DAC | Signal for First VM DAC |
|---|---|---|---|
| 65 | 1000001 | 10 | 00001 |
| * * * | * * * | * * * | * * * |
| 95 | 1011111 | 10 | 11111 |
| 96 | 1100000 | 11 | 00000 |
| 97 | 1100001 | 11 | 00001 |

Figure 7B:
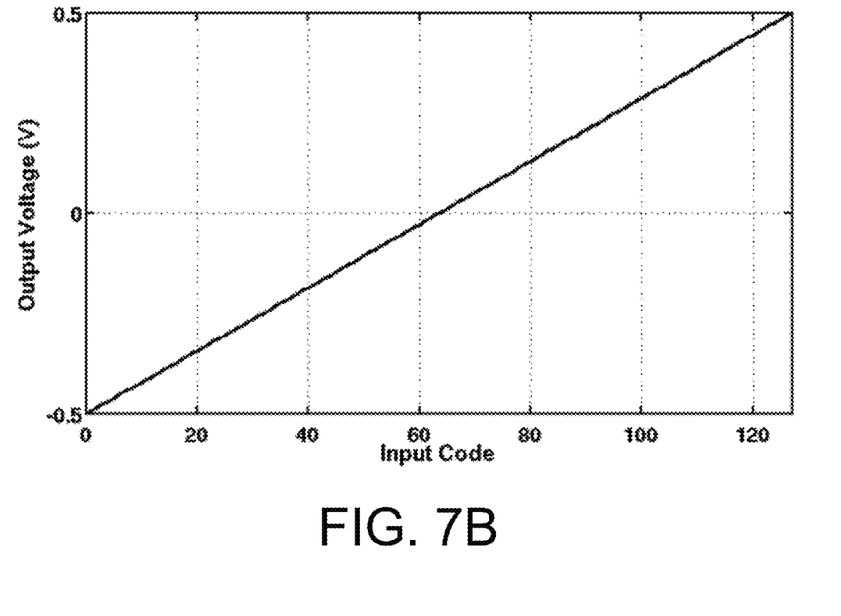
FIG. 7B shows an output voltage of a DAC with a compensation circuit, according to some embodiments.

Accordingly, the inventor has conceived and developed new DACs that employ compensation circuits to adjust a step size of a second DAC to be exactly (or approximately) an integer multiple of two of the step size of a first DAC. Thereby, DACs (e.g., VM DACs) with impedance arrays that are weighted differently may be combined allowing for DACs with a larger output swing voltage for a given net termination impedance to be created. FIG. 7B shows an example voltage output of a DAC employing such compensation circuits. As shown, the voltage drops 702, 704, and 706 in FIG. 7A have been removed resulting in a linear relationship between the 7-bit binary coded signal and the output voltage.

The aspects and embodiments described above, as well as additional aspects and embodiments, are described in greater detail further below. These aspects and/or embodiments may be used individually, all together, or in any combination of two or more, as the application is not limited in this respect.

Figure 1:
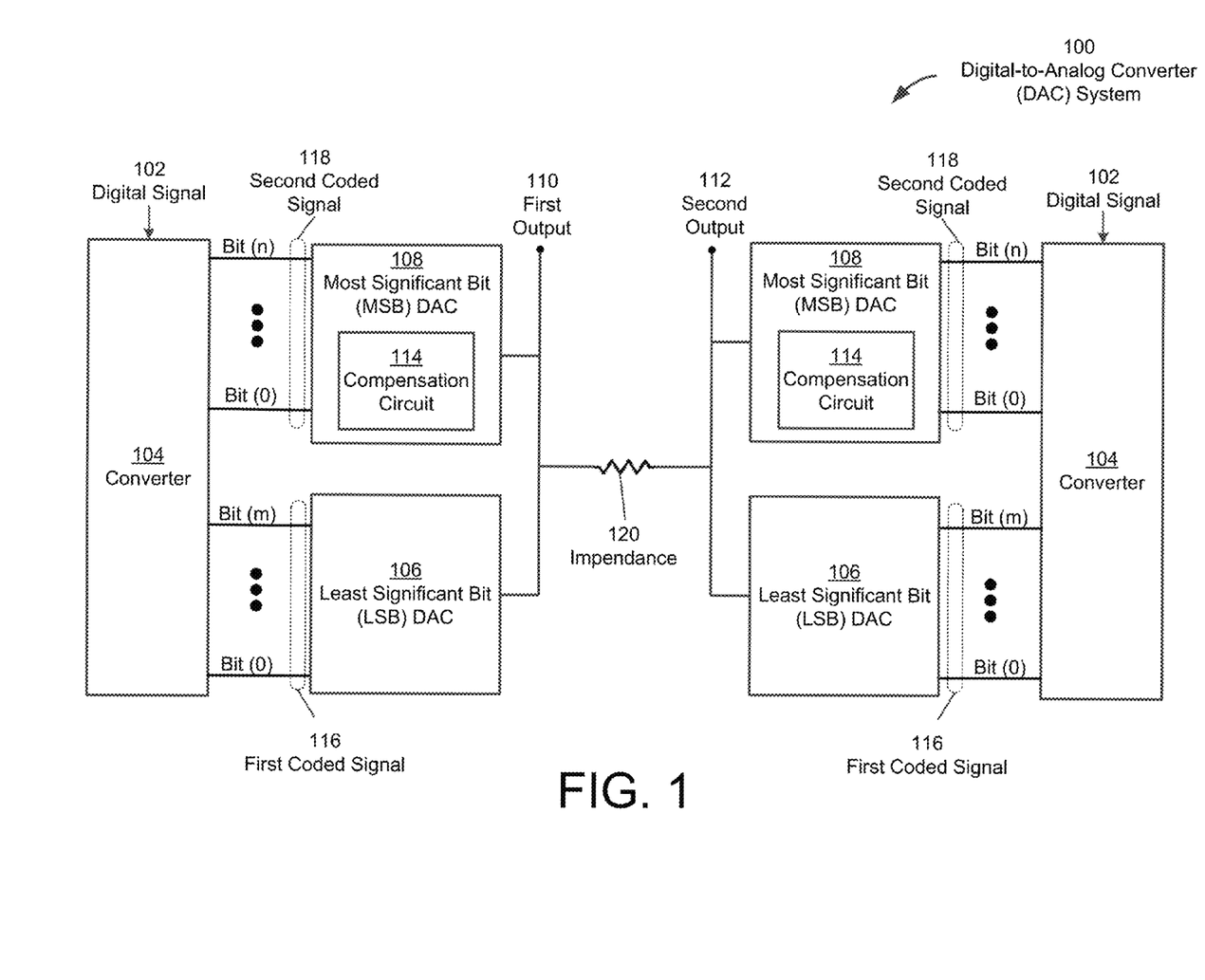
FIG. 1 shows a diagram of a digital-to-analog converter (DAC) system, according to some embodiments.

FIG. 1 shows a diagram of a DAC system 100 that produces a linear output voltage while employing a first DAC for the MSBs (MSB DAC 108) with a different impedance weighting scheme than a second DAC for the LSBs (LSB DAC 106), according to some embodiments. For example, both the MSB DAC 108 and the LSB DAC 106 may employ a binary weighted impedance array but the impedance values of the binary weighted impedance array of the MSB DAC 108 may not be an integer multiple of two of any single impedance used in the binary impedance array of the LSB DAC 106. In another example, the LSB DAC 106 may employ a binary weighted impedance array and the MSB DAC 108 may employ a non-binary weighted impedance array.

The DAC system 100 is a differential DAC configured to receive a digital signal 102 and provide analog output signals at the first and second outputs 110 and 112, respectively. The first and second outputs 110 and 112, respectively, are coupled by an impedance 120. The analog output signal at the second output 112 may be an inverted version of the analog output signal at the first output 110. The DAC system 100 includes a converter 104 that receives the digital signal 102 and provides a first coded signal 116 comprising an arbitrary number of bits (e.g., m bits) to the LSB DAC 106 based on the received digital signal 102. The LSB DAC 106 receives the first coded signal 116 and generates an output voltage based on a magnitude of the first coded signal 116. The converter 104 also provides a second coded signal 118 comprising an arbitrary number of bits (e.g., n bits) to the MSB DAC 108. The MSB DAC 108 receives the second coded signal 118 and generates an output voltage based on a magnitude of the second coded signal 118. It should be appreciated that the first and second coded signals 116 and 118, respectively, may be coded using any of a variety of techniques such as binary coding and thermometer coding.

For example, the first and second coded signals 116 and 118, respectively, may be binary coded, thermometer coded, or a combination thereof.

The converter 104 receives the digital signal 102 and generates the first and second coded signals 116 and 118, respectively, based on the received digital signal 102. The converter 104 may segment the received digital signal 102 into two portions and generate the first coded signal 116 using a first portion of the digital signal 102 and generate the second coded signal 118 using a second portion of the digital signal 102. For example, the digital signal 102 may be a binary coded signal comprising 7 bits and the converter 104 may separate the 2 MSBs from the 5 LSBs. In this example, the 2 MSBs may be provided to a decoder (e.g., a binary-to-thermometer decoder) included in the converter 104 to generate the second coded signal 118. The 5 LSBs from the digital signal 102 may be directly provided to the LSB DAC as the first coded signal 116. It should be appreciated that, in some embodiments, the converter 104 may be omitted altogether. For example, the digital signal 102 may be a binary coded signal and the first m bits of the digital signal 102 may be directly provided to the LSB DAC 106 as the first coded signal 116 and the remaining n bits in the digital signal 102 may be provided to the MSB DAC 108 as the second coded signal 118.

The LSB DAC 106 is configured to receive the first coded signal 116 and generate an output voltage based on the received first coded signal 116. For example, the LSB DAC 106 may be configured to provide the output voltage at a level selected from a plurality of levels based on the received first coded signal 116. The LSB DAC 106 may be constructed in any of a variety of ways. For example, the LSB DAC 106 may be a VM DAC with a binary weighted impedance array.

The MSB DAC 108 is configured to receive the second coded signal 118 and generate an output voltage based on the received second coded signal 118. For example, the MSB DAC 108 may be configured to provide the output voltage at a level selected from a plurality of levels based on the received second coded signal 118. The MSB DAC 108 may include an impedance array that is weighted differently than the LSB DAC 106. For example, the LSB DAC 106 may include an impedance array that is binary weighted (e.g., a set of impedances 100Ω, 200Ω, and 400Ω) and the MSB DAC 108 may include an impedance array that is binary weighted using impedances that are not a factor of two of the impedances in the impedance array of the LSB DAC 106 (e.g., a set of impedances 150Ω, 300Ω, and 600Ω). In another example, the MSB DAC 108 may be an arbitrarily segmented DAC. An arbitrarily segmented DAC may be a combination of a thermometer coded DAC (e.g., a DAC configured to receive a thermometer coded signal and provide an output voltage) and a binary coded DAC (e.g., a DAC configured to receive a binary coded signal and provide an output voltage). The impedances in an impedance array associated with the thermometer coded DAC may be equal while the impedances in an impedance array associated with the binary coded DAC may increase by a factor of two.

The MSB DAC 108 includes a compensation circuit 114 configured to adjust a step size of the DAC 108 such that the step size is exactly (or approximately) an integer multiple of the step size of the LSB DAC 106. For example, the output voltage at a level selected from the plurality of levels may be adjusted to be exactly (or approximately) an integer multiple of two of the step size of the LSB DAC 106. Thereby, a linear relationship between the received digital signal 102 and an analog signal provided at the outputs 110 and 112 may be maintained despite the LSB DAC 106 employing a different impedance weighting scheme relative to MSB DAC 108.

Figure 2:
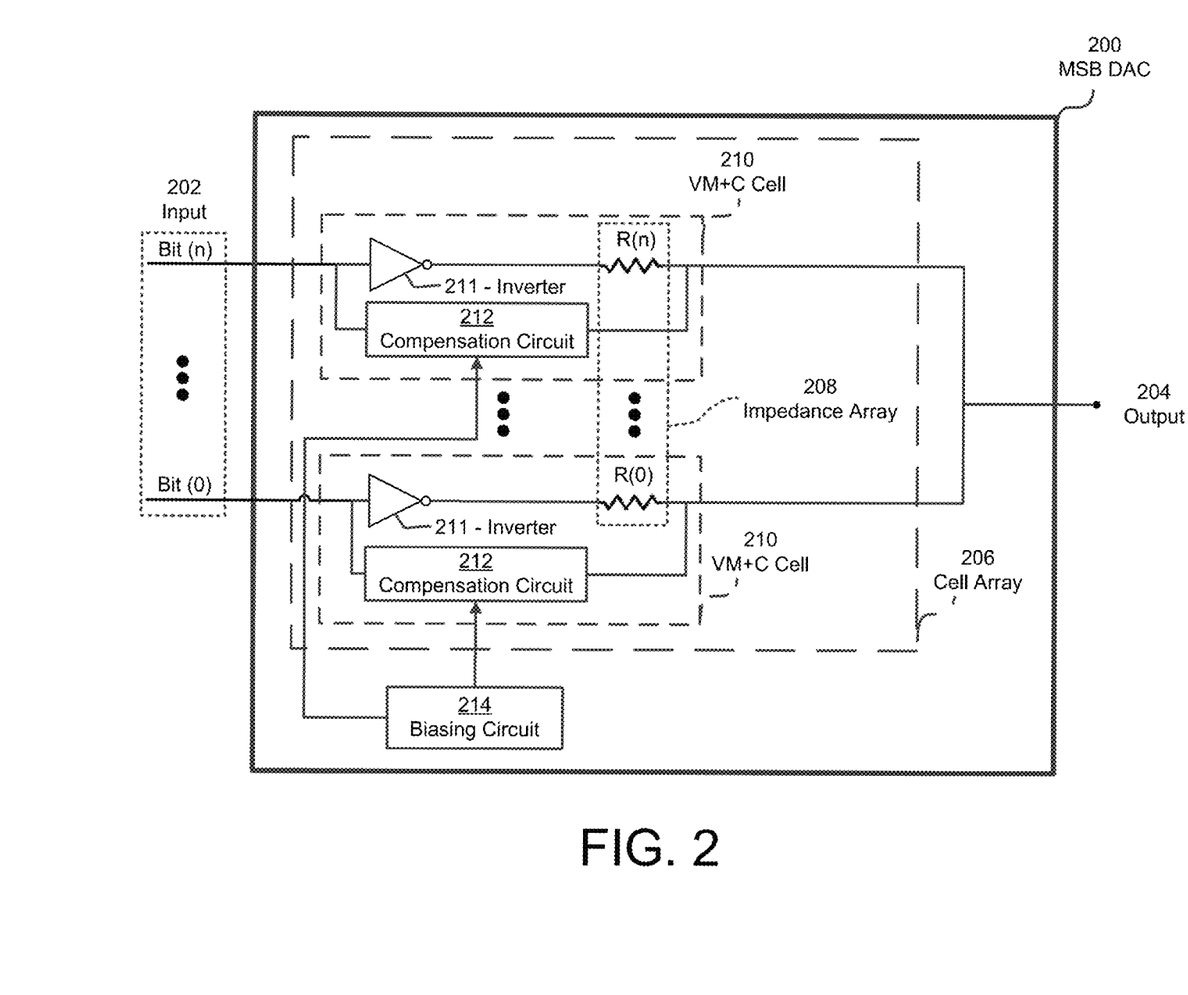
FIG. 2 shows a detailed diagram of a most significant bit (MSB) DAC, according to some embodiments.

FIG. 2 shows a detailed diagram of a MSB DAC 200, according to some embodiments. The MSB DAC 200 may be used as, for example, the MSB DAC 108 in FIG. 1. As shown, the MSB DAC 200 includes an input 202 to receive a coded signal (e.g., a binary coded signal, a thermometer coded signal, or a combination thereof) comprising an arbitrary number of bits (e.g., n bits) and an output 204 to provide an output voltage. The MSB DAC 200 includes a cell array 206 including a plurality of voltage mode with compensation (VM+C) cells 210. The number of VM+C cells 210 in the cell array 206 relative to the number of bit lines at the input 202 may be, for example, a one-to-one relationship. Thereby, each bit line at the input 202 may be coupled to one VM+C cell 210.

The VM+C cells 210 may be constructed to control an output voltage level based on a state of a bit received from the input 202 and a biasing signal from a biasing circuit 214. The configuration of the various VM+C cells 210 in the cell array 206 may control an output voltage of the MSB DAC 200. As shown, the VM+C cells 210 include an inverter 211 coupled to an impedance R(n) from the impedance array 208 and a compensation circuit 212 that is coupled in parallel with the inverter 211 and the impedance R(n) from the impedance array 208. The compensation circuit 212 may allow the output voltage the VM+C cells 210 to be fined tuned. The magnitude of the compensation introduced by the compensation circuit 212 in the VM+C cells 210 may be controlled by the biasing circuit 214. The biasing circuit 214 may change the compensation applied by the compensation circuits 212 such that the resulting step sizes of the MSB DAC 200 are exactly (or approximately) an integer multiple of two of the step size of another DAC (e.g., an LSB DAC).

The impedance array 208 may comprise n impedances corresponding to the n bits at the input 202. The impedances in the impedance array 208 may be binary weighted or non-binary weighted. For example, the input 202 may be a thermometer coded signal and the DAC 200 may be thermometer coded. In this example, the impedances in the impedance array 208 may be non-binary weighted (e.g., all of the impedances R(0)-R(n) have the same impedance). In another example, the input 202 may be a binary coded signal and the impedances in the impedance array 208 may be binary weighted.

Figure 3:
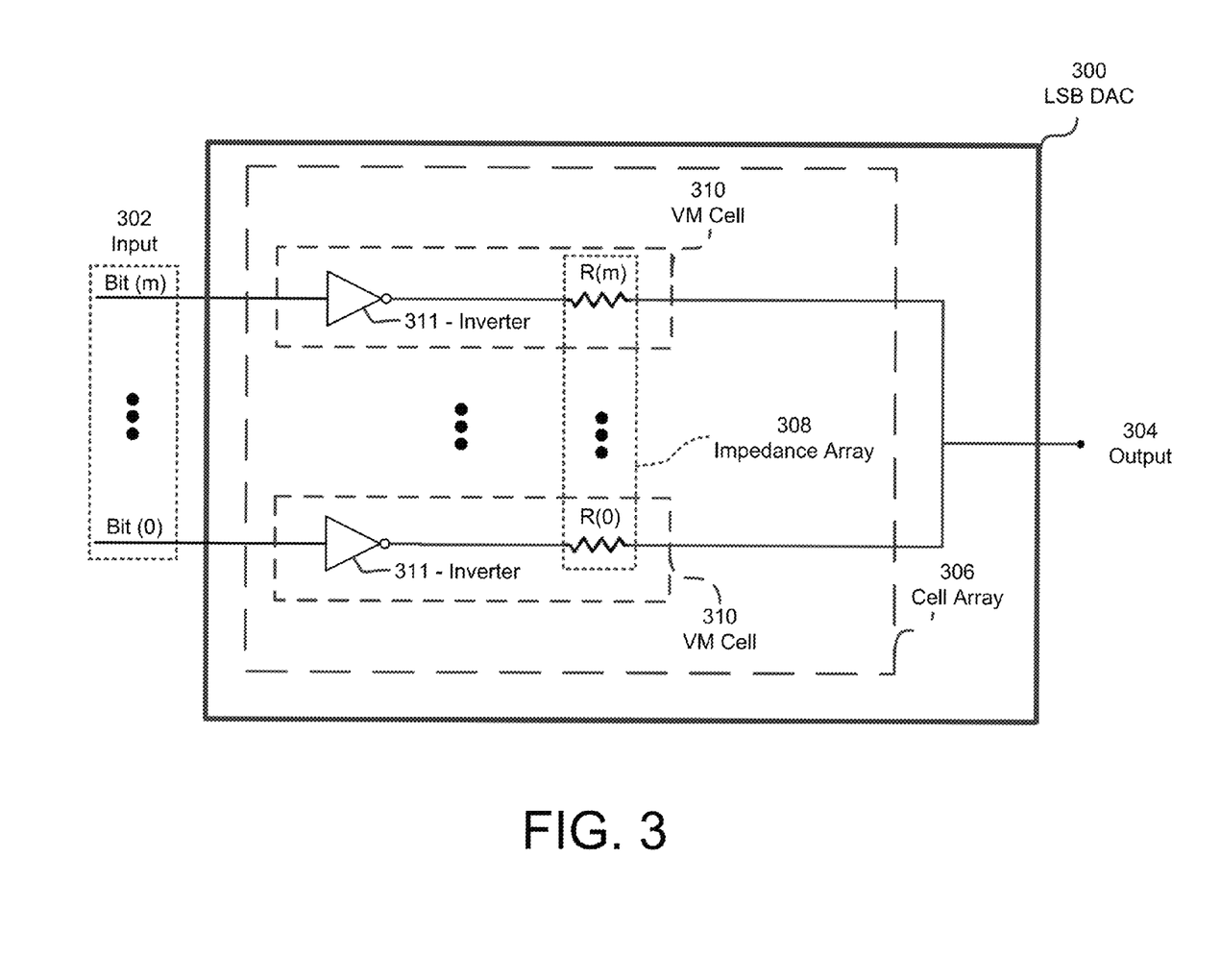
FIG. 3 shows a detailed diagram of a least significant bit (LSB) DAC, according to some embodiments.

FIG. 3 shows a detailed diagram of an LSB DAC 300, according to some embodiments. The LSB DAC 300 may be used as, for example, the LSB DAC 106 in FIG. 1. As shown, the LSB DAC 300 includes an input 302 to receive a coded signal (e.g., a binary coded signal) comprising an arbitrary number of bits (m bits) and an output 304 to provide an output voltage. The LSB DAC 300 includes a cell array 306 including a plurality of VM cells 310. Each of the cells includes an inverter 311 coupled in series with an impedance R(m) from an impedance array 308. The number of VM cells 310 in the cell array 306 relative to the number of bit lines at the input 302 may be, for example, a one-to-one relationship. Thereby, each bit line at the input 302 may be coupled to one VM cell 310.

The VM cells 310 selectively couple the output of the cell to a supply voltage or a reference voltage (e.g., ground) based on a state of a bit from the input 302. For example, the VM cell 310 may couple the output of the cell to a supply voltage in response to the state being a logic "0" and couple the output of the cell to the reference voltage (e.g., ground) in response to the state being a logic "1." The configuration of the VM cells 310 in the cell array 306 may determine an output voltage at the node 304.

The impedance array 308 may comprise m impedances corresponding to the m bits in the input 302. The impedances in the impedance array 308 may be binary weighted. For example, the impedances across the range of R(m) to R(0) may double with each step (e.g., R(0) is double R(1) and quadruple R(2)).

Figure 4:
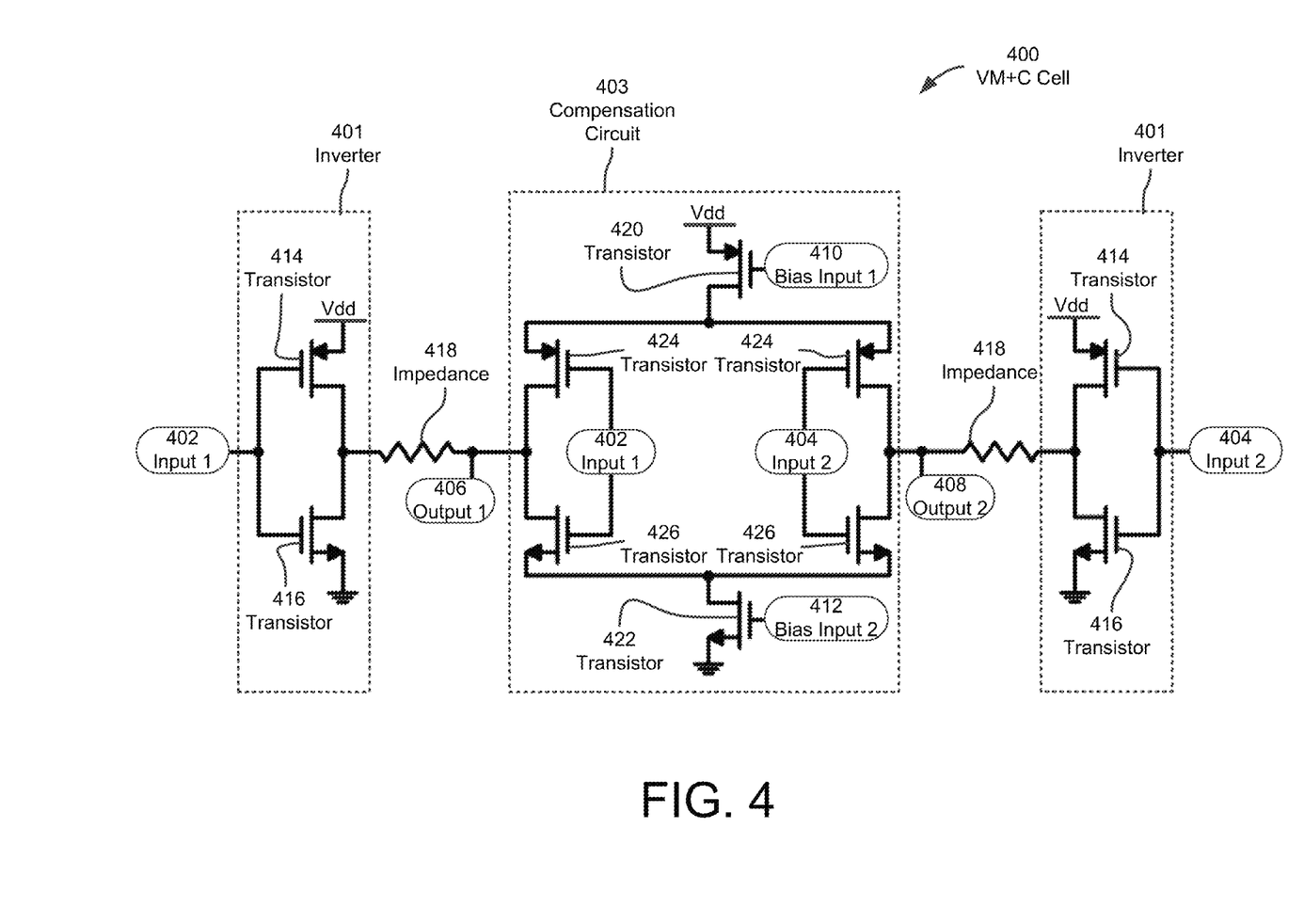
FIG. 4 shows a detailed diagram of voltage mode with compensation (VM+C) cell, according to some embodiments.

FIG. 4 shows a detailed diagram of a VM+C cell 400, according to some embodiments. The VM+C cell 400 includes a first input 402 to receive a state of a bit, a second input 404 to receive an inverted version of the state of the bit, a first output 406 to provide an output signal, a second output 408 to provide an inverted version of the output signal, a first bias input 410 to receive a first bias input signal from a biasing circuit (e.g., biasing circuit 214), a second bias input 412 to receive a second bias input signal from a biasing circuit (e.g., biasing circuit 214), inverters 401, and a compensation circuit 403 coupled between the inverters 401. The inverters 401 are coupled to the compensation circuit 403 by an impedance 418.

The VM+C cell 400 may be used as, for example, VM+C cell 210 in FIG. 2. Aligning the VM+C cell 400 with the VM+C cell 210 in FIG. 2, the impedance 418 may be the impedance R(n) from the impedance array 208, the inverter 401 may be the inverter 211, and the compensation circuit 403 may be the compensation circuit 212.

The inverters 401 include a pair of transistors 414 and 416 coupled in series between a supply voltage $V_{dd}$ and a reference potential (e.g., ground). The transistor 414 may be a p-type transistor and the transistor 416 may be an n-type transistor. The gate terminals of the transistors 414 and 416 may be coupled to an input of the VM+C cell 400 (e.g., the first input 402 or the second input 404).

The compensation circuit 403 includes two pairs of series transistors 424 and 426 that are coupled to a supply voltage $V_{dd}$ by a transistor 420 and coupled to a reference potential (e.g., ground) by a transistor 422. The transistors 420 and 424 may be p-type transistors and the transistors 426 and 422 may be n-type transistors. The gate terminals of each of the transistors 424 and 426 may be coupled to an input of the VM+C cell 400 (e.g., the first input 402 or the second input 404). The gate terminal of the transistor 420 may be configured to receive the first bias signal from the first bias input 410. The gate terminal of the transistor 422 may be configured to receive the second bias signal from the second bias input 412. The bias signals may control, for example, an adjustment provided to the output signal by the compensation circuit 403.

Figure 5:
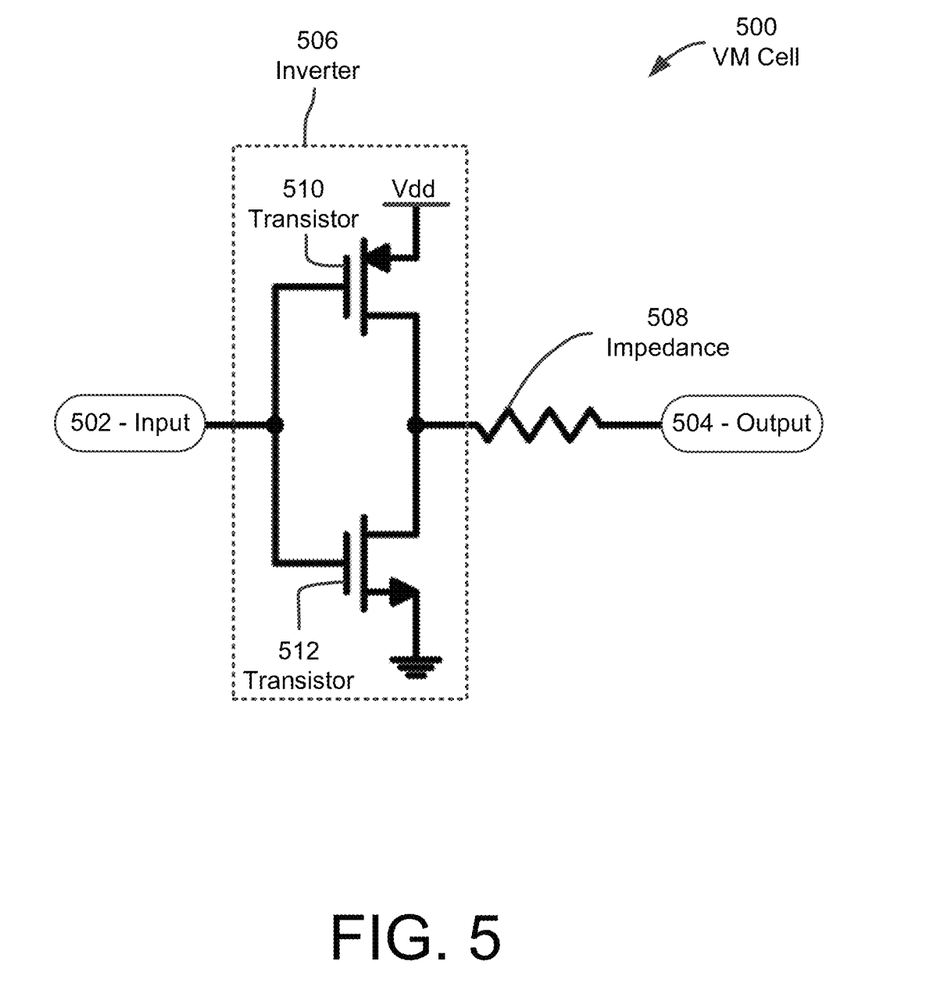
FIG. 5 shows a detailed diagram of a voltage mode (VM) cell, according to some embodiments.

FIG. 5 shows a detailed diagram of a VM cell 500, according to some embodiments. The VM cell 500 includes an inverter 506 coupled in series with an impedance 508 between an input 502 and an output 504. The inverter 506 includes two transistors 510 and 512 coupled in series between a supply voltage $V_{dd}$ and a reference potential (e.g., ground). As shown, the transistor 510 may be p-type transistor and the transistor 512 may be an n-type transistor. The gate terminals of the transistors 510 and 512 may be coupled to the input 502.

The VM cell 500 may be used as, for example, VM cell 310 in FIG. 3. Aligning the VM cell 500 with the VM cell 310 in FIG. 3, the impedance 508 may be the impedance R(m) from the impedance array 308 and the inverter 506 may be the inverter 311.

Figure 6:
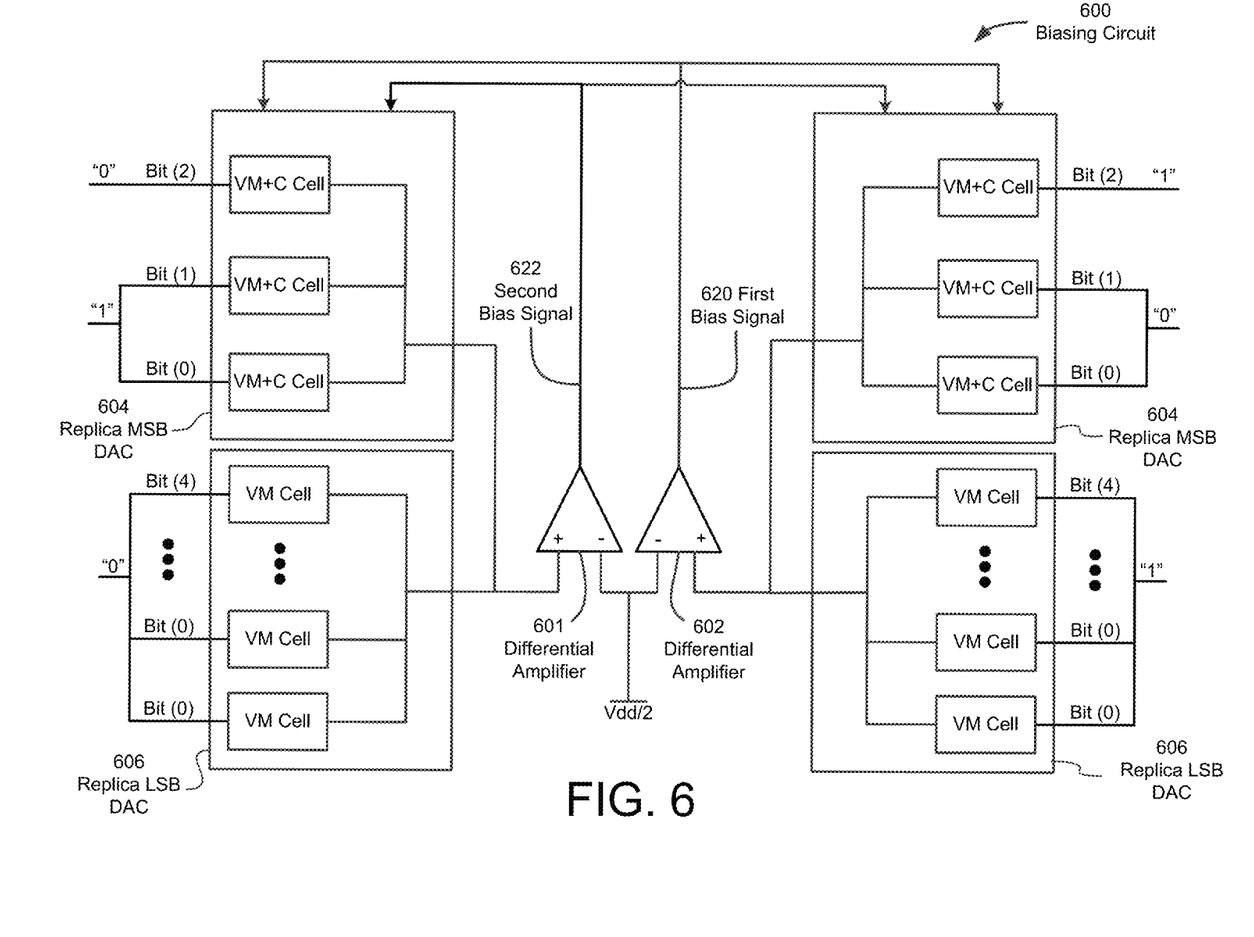
FIG. 6 shows a detailed diagram of a biasing circuit, according to some embodiments.

FIG. 6 shows a detailed diagram of a biasing circuit 600, according to some embodiments. The biasing circuit 600 may be employed as, for example, the biasing circuit 214 in FIG. 2. The biasing circuit 600 may be a modified (or unmodified) replica of the DAC system being controlled (e.g., DAC system 100 in FIG. 1). The particular biasing circuit shown in FIG. 6 is constructed to generate a first bias signal 620 and a second bias signal 622 for a 7-bit DAC system comprising an MSB DAC configured to receive a 3 bit thermometer coded signal and an LSB DAC configured to receive a 5 bit binary coded signal.

As shown in FIG. 6, the biasing circuit 600 includes replica MSB DACs 604 (e.g., replicas of MSB DAC 108) and replica LSB DACs (e.g., replicas of LSB DAC 106). The inputs to the replica MSB DACs 604 and replica LSB DACs 606 may be designed such that the output voltage to differential amplifiers 601 is a fixed voltage within the range of the replica DACs (e.g., at a mid-point in the range of the DACs). The actual output from the replica DACs may be compared with the ideal output (e.g., half of $V_{dd}$) using the differential amplifiers 601 and 602. The difference between the actual output from the replica DACs and the ideal output may be used as the first and second bias signals 620 and 622, respectively. These bias signals 620 and 622 may be provided to compensation circuits in the replica MSB DACs 604 in addition to compensation circuits in MSB DACs (e.g., the MSB DAC 108) of the DAC system (e.g., the DAC system 100). For example, the first bias signal 620 may be provided to the first bias input 410 of the compensation circuit 403 and the second bias signal 622 may be provided to the second bias input 412 of the compensation circuit 403.

It should be appreciated that the replica MSB and LSB DACs 604 and 606, respectively, may not be identical replicas of the MSB and LSB DACs in the DAC system. For example, the replica MSB and LSB DACs 604 and 606, respectively, may be scaled down versions of the MSB and LSB DACs in the DAC system to reduce the power consumption of the biasing circuit 600.

Above embodiments of differential DACs have been described. The techniques described herein are not limited to differential DACs, as such techniques may be applied to single ended DACs, for example. Further, the techniques described herein are not limited to VM DACs, as such techniques may be applied to other types of DACs, such as current mode (CM) DACs, for example.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

It should be appreciated that the above described transistors (e.g., the transistors in FIGS. 4 and 5) may be implemented in any of a variety of ways. For example, the transistors may be implemented as bipolar junction transistors or field-effect transistors (FETS), such as metal-oxide semiconductor field-effect transistors (MOSFETs).

The terms "approximately," "about," and "substantially" may be used to mean within ±5% of a target value in some embodiments. The terms "approximately," "about," and "substantially" may include the target value. It should be appreciated that the terms "approximately," "about," and "substantially" may be used to refer to a range smaller than ±5% of a target value such as: ±2% of a target value, ±1% of a target value, ±0.5% of a target value, ±0.2% of a target value, and ±0.1% of a target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A digital-to-analog converter (DAC) circuit configured to receive a digital signal and provide an analog signal, the circuit comprising:
    a first circuit configured to receive a first portion of the digital signal and generate a first output voltage at a level selected from a first plurality of levels based on the first portion of the digital signal, wherein at least two adjacent voltage levels of the first plurality of levels have a first potential difference;
    a second circuit configured to receive a second portion of the digital signal and generate a second output voltage at a level selected from a second plurality of levels based on the second portion of the digital signal, wherein at least two adjacent voltage levels of the second plurality of levels have a second potential difference and wherein the second circuit comprises at least one compensation circuit configured to adjust the second potential difference such that the second potential difference is an integer multiple of the first potential difference; and
    an output node coupled to the first circuit and the second circuit, the output configured to provide the output analog signal.

2. The circuit of claim 1, wherein the first circuit comprises a first impedance array and wherein the second circuit comprises a second impedance array that is weighted differently than the first impedance array.

3. The circuit of claim 2, wherein the first impedance array comprises a first binary weighted impedance array and the second impedance array comprises a second binary weighted impedance array, each impedance of the second binary weighted impedance array having an impedance that is not a multiple of two of any single impedance in the first binary weighted impedance array.

4. The circuit of claim 2, wherein the first impedance array comprises a binary weighted impedance array and the second impedance array comprises a non-binary weighted impedance array.

5. The circuit of claim 1, wherein the digital signal is a binary coded signal comprising a plurality of bits.

6. The circuit of claim 5, further comprising a third circuit configured to receive the first portion of the digital signal, convert the first portion of the digital signal from a binary coding to a non-binary coding, and provide the converted first portion of the digital signal to the first circuit.

7. The circuit of claim 5, wherein the first portion of the digital signal is a first subset of the plurality of bits comprising a most significant bit of the plurality of bits and the second portion of the digital signal is a second subset of the plurality of bits comprising a least significant bit of the plurality of bits.

8. The circuit of claim 1, wherein the second circuit comprises a biasing circuit configured to generate at least one bias signal and the compensation circuit is configured to adjust the second potential difference based on the at least one bias signal.

9. The circuit of claim 8, wherein the biasing circuit comprises a replica of the first circuit, the second circuit, or a combination thereof.

10. A digital-to-analog converter (DAC) circuit configured to receive a digital signal comprising a plurality of bits and provide an analog signal, the circuit comprising:
- a first cell array comprising a first plurality of cells each being configured to receive a state of one bit from a first subset of the plurality of bits and provide an output based on the received state of the one bit, each cell in the first cell array comprising an inverter coupled in series with one impedance from a first impedance array and a compensation circuit coupled in parallel with the inverter and the one impedance from the first impedance array, the compensation circuit being configured to receive at least one bias signal and adjust the output of the at least one cell based on the at least one bias signal; and
- a second cell array comprising a second plurality of cells each being configured to receive a state of one bit from a second subset of the plurality of bits and provide an output based on the received state of the one bit, each cell in the second cell array comprising an inverter coupled in series with one impedance from a second impedance array; and
- an output coupled to the first and second cell arrays, the output being configured to provide the analog signal.

11. The circuit of claim 10, wherein the first impedance array is weighted differently than the second impedance array.

12. The circuit of claim 11, wherein the first impedance array comprises a first binary weighted impedance array and the second impedance array comprises a second binary weighted impedance array, each impedance of the second binary weighted impedance array having an impedance that is not a multiple of two of any single impedance in the first binary weighted impedance array.

13. The circuit of claim 11, wherein the first impedance array is a binary weighted impedance array and the second impedance array is a non-binary weighted impedance array.

14. The circuit of claim 10, wherein the compensation circuit comprises a first transistor coupled in series with a second transistor, each of the first and second transistors having a gate terminal configured to receive the state of one bit from a first subset of the plurality of bits and a drain terminal coupled to the one impedance from the first impedance array.

15. The circuit of claim 14, wherein the first transistor is a p-type transistor and the second transistor is an n-type transistor.

16. The circuit of claim 15, wherein the compensation circuit further comprises:
- a third transistor coupled between a source terminal of the first transistor and a supply voltage; and
- a fourth transistor coupled between a source terminal of the second transistor and a reference potential.

17. The circuit of claim 16, wherein the third transistor comprises a gate terminal configured to receive a first bias signal and the fourth transistor comprises a gate terminal configured to receive a second bias signal.

18. The circuit of claim 10, wherein the digital signal is binary coded, thermometer coded, or a combination thereof.

19. The circuit of claim 10, further comprising a biasing circuit configured to generate the at least one bias signal.

20. The circuit of claim 19, wherein the biasing circuit comprises a replica of at least a portion of the first and second plurality of cells.

\* \* \* \* \*